United States Patent
Chang et al.

(10) Patent No.: US 7,539,094 B2
(45) Date of Patent: May 26, 2009

(54) MULTI-BIT STREAM OF MULTIMEDIA DATA PROCESSING

(75) Inventors: Shih-Cheng Chang, Chung Ho (TW); Chi-Hsien Shih, Chung Ho (TW)

(73) Assignee: Avermedia Technologies, Inc., Chung Ho (TW)

( * ) Notice: Subject to any disclaimer, the term of this patent is extended or adjusted under 35 U.S.C. 154(b) by 631 days.

(21) Appl. No.: 11/380,908

(22) Filed: Apr. 28, 2006

(65) Prior Publication Data
US 2007/0168198 A1 Jul. 19, 2007

(30) Foreign Application Priority Data
Jan. 19, 2006 (TW) ............................... 95102087 A

(51) Int. Cl.
*G11B 5/09* (2006.01)
*H04J 3/22* (2006.01)

(52) U.S. Cl. .................... 369/47.12; 369/59.1; 704/503
(58) Field of Classification Search ..................... None
See application file for complete search history.

(56) References Cited

U.S. PATENT DOCUMENTS

| 7,180,909 B1* | 2/2007 | Achler ................. 370/466 |
| 2004/0047608 A1* | 3/2004 | Takayama et al. ............. 386/96 |
| 2004/0212843 A1* | 10/2004 | Kodama et al. ........ 358/426.01 |
| 2005/0206784 A1* | 9/2005 | Li et al. ..................... 348/441 |

* cited by examiner

Primary Examiner—Muhammad N. Edun

(57) ABSTRACT

A system for processing multimedia data outputs multiple digital data streams of different compressed ratios or types to adapt to multiple limitations of storage spaces and transmission bandwidths, and thus reduce the repetition for processing the digital data streams to save the central processing unit (CPU) resources.

11 Claims, 4 Drawing Sheets

MULTI-BIT STREAM OF MULTIMEDIA DATA PROCESSING

RELATED APPLICATIONS

The present application is based on, and claims priority from, Taiwan Application Serial Number 95102087, filed Jan. 19, 2006, the disclosure of which is hereby incorporated by reference herein in its entirety.

BACKGROUND

1. Field of Invention

The present invention relates to a system for processing multimedia data. More particularly, the present invention relates to a system for transmitting and storing the multimedia data.

2. Description of Related Art

Multimedia is comprised of audio-visual data. The visual data is comprised of still pictures and video images. The audio data is comprised of speech data and sound data. In general, the still data images and the speech data are the underlying basis of visual data and audio data respectively, wherein the still data image will not change with time and the speech data has the frequencies, bandwidth and statistical properties characteristic of human voice. The forgoing properties will be useful in processing digital signals.

However, because of the unpredictability of the storage space and the bandwidth limitations of later use when processing the data, in general, before the digital data is being stored or transmitted, the processed (compressed) digital data is decompressed and then compressed again according to the required compression ratio before being stored or transmitted. Thus, the conventional method for processing audio-visual data wastes central processing unit (CPU) resources and degrades the performance of the entire system, and the repetition of processing also deteriorates the quality of the signal so as to distort the multimedia data.

FIG. 1 is a block diagram showing a conventional system for processing multimedia data. As shown in FIG. 1, a primitive signal 102 enters a compressor 104. The compressor 104 converts the primitive signal 102 into a digital data stream 106, wherein the primitive signal 102 may be a digital signal or an analogy signal and the compressor may be an application-specific integrated circuit (ASIC) or a digital signal processor (DSP) chip, which may be dedicated to processing video or audio data. The digital data stream 106 is then transmitted to a compressor/decompressor 112. Furthermore, the compressor/decompressor 112 may be a image processing system, a computer or a server for decompressing/compressing the digital data stream one or more times, wherein the compression ratio of the compression is varied according to the storage space of a next device (for example, a hard disk 114) or the bandwidth limitations of a next path (for example, a wired/wireless network 116 or a network of a cell phone 118). The digital data stream 106 is compressed into digital data streams 120, 122 or 124 to be suitable for transmission through the next path or stored into the next storage, for example, a hard disk 114, a network 116 or a cell phone 118.

FIG. 2 is a flow chart illustrating a conventional method for processing multimedia data. As shown, after the flow starts in Step 202, a primitive signal is received by a compressor in Step 204 and compressed into a single digital data stream in Step 206 by the compressor, and the single data stream is transmitted to a decompressor/compressor in Step 207. The decompressor/compressor then determines the compression ratio of the digital data stream according to the storage space of a next device or the bandwidth limitations of a next path in Step 208. For example, if the digital data stream requires compression with a high compression ratio because of limited storage space of the next device or a limited bandwidth of the next path, the digital data stream is decompressed in advance in Step 210 and then compressed into a digital data stream with a high compression ratio in Step 212. Finally, the digital data stream with the high compression ratio is transmitted or stored in Step 214. Similarly, if a low compression ratio is required, the digital data stream is decompressed in advance and compressed again into a digital data stream with a low compression ratio.

To sum up, future storage space and bandwidth limitations during the signal processing stage are unpredictable. Therefore, after Step 208 of FIG. 2, the processed digital signal has to be restored/decompressed, for example, in Step 210, 220 or 230 and processed/compressed again according to the required compression ratio, for example, in Step 212, 222 or 232, and finally the recompressed digital data stream is stored or transmitted, for example, in Step 214, 224 or 234. The above-mentioned complicated system has a redundant procedure and wastes central processing unit (CPU) resources degrading the performance of the system. Moreover, the redundant procedure on the digital data stream will reduce the quality of the signal and thus distort the multimedia data.

SUMMARY

The objective of the present invention is to eliminate the redundant procedure. In the video aspect, an application-specific integrated circuit (ASIC) or a digital signal processor (DSP) may rescale the primitive image to produce multiple data streams with different data sizes that depend on the different data sizes applied by different processing infrastructures or standards after the primitive data has been received. In the audio aspect, an application-specific integrated circuit (ASIC) or a digital signal processor (DSP) may produce multiple data streams with different data sizes according to the different audio properties applied by different processing infrastructures or standards after primitive data has been received. Therefore, the redundant time that a central processing unit (CPU) uses to restore and recompress data may be reduced, and data distortion may also be reduced. Furthermore, the overall system may be further simplified.

A system for processing multimedia data is provided according to one preferred embodiment of this invention. The system comprises: a primitive signal; and a compressor to convert the primitive signal into multiple digital data streams having different compression ratios or compression types, wherein the compressor chooses a digital data stream with a suitable compression ratio or compression type applied to the storage or transmission of multimedia signals from multiple digital data streams with different compression ratios or compression types according to the storage space of a next device or the bandwidth limitations of a next path.

A method for processing multimedia data is provided according to another preferred embodiment of this invention. The method comprises steps of: converting a received primitive signal into multiple digital data streams with different compression ratios or compression types; choosing a digital data stream with a suitable compression ratio or compression type from multiple digital data streams with different compression ratios or compression types according to the storage space of the next device or the bandwidth limitations of the next path; and storing or transmitting the chosen digital data stream with a suitable compression ratio or compression type.

The invention has the advantages of:
1. saving central processing unit (CPU) resources and thus improving the performance of the system.
2. removing redundant procedures from the digital data stream and thus maintain the quality of the signal so as not to distort the multimedia data.
3. providing digital data streams of multiple compression ratios or compression types to be applied in variable conditions without additional devices in charge of compression or decompression according to a configuration of a user, a default configuration of a system or the built-in program of a system after incorporating the present invention into an application-specific integrated circuit (ASIC) or a digital signal processor (DSP).
4. simplifying the procedure for processing multimedia data and thus improving system performance.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
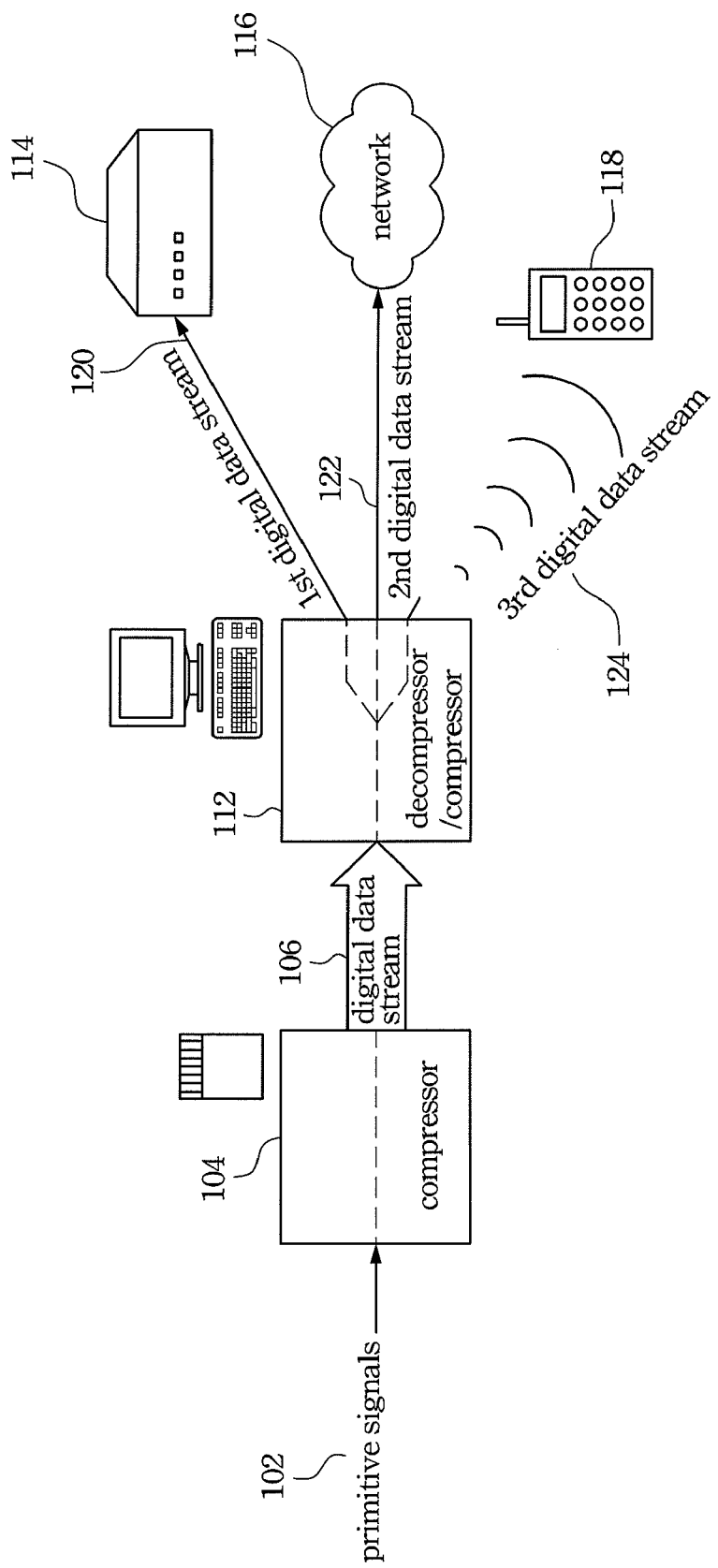
FIG. 1 is a block diagram illustrating a conventional system for processing multimedia data.
Figure 2:
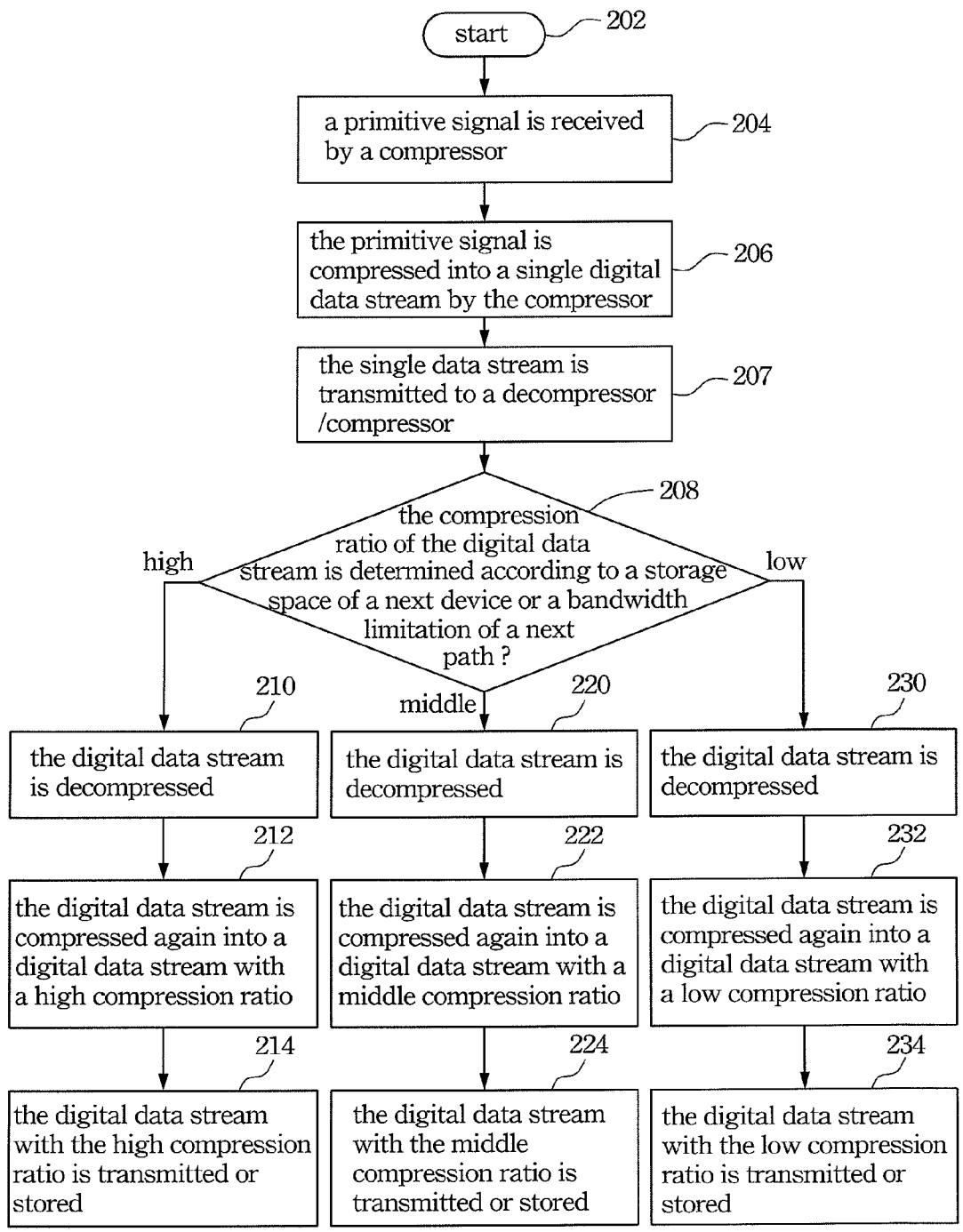
FIG. 2 is a flow chart illustrating a conventional method for processing multimedia data.

Reference will now be made in detail to the present preferred embodiments of the invention, examples of which are illustrated in the accompanying drawings. Wherever possible, the same reference numbers are used in the drawings and the description to refer to the same or like parts.

Figure 3:
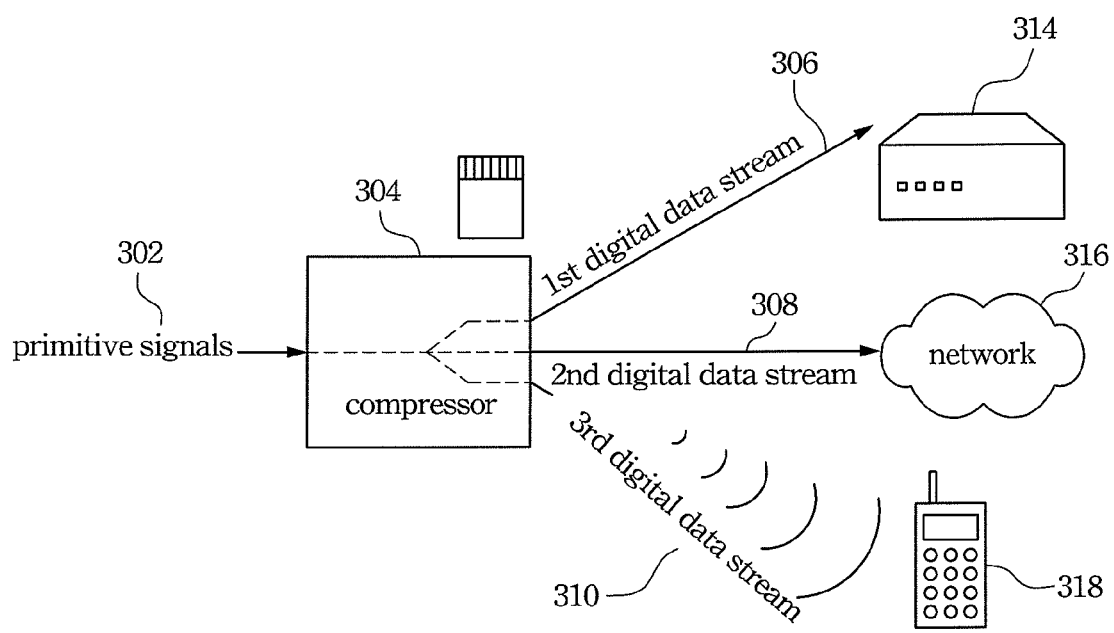
FIG. 3 is a block diagram illustrating a system for processing multimedia data according to one preferred embodiment of this invention.

FIG. 3 is a block diagram illustrating a system for processing multimedia data according to one preferred embodiment of this invention. As shown, a primitive signal 302 is entered into a compressor 304, and the compressor 304 converts the primitive signal 302 into multiple digital data streams (for example, three digital data streams in this embodiment) with different compression ratios or compression types, such as the first digital data stream 306 has a low compression ratio (for example, 10%) and a compression type (for example, M-JPEG); the second digital data stream 308 has a medium compression ratio (for example, 1%) and another compression type (for example, MPEG-4); or the third digital data stream 310 has a high compression ratio (for example, 0.6%) and a third compression type (for example, H.264).

In a further embodiment, the compressor 304 may concurrently produce multiple digital data streams with the same or different compression ratios or compression types, for example, the first digital data stream 306 and the second digital data stream 308 both possess the first compression ratio and the first compression type, and the third digital data stream 310 possesses the second compression ratio and the second compression type that is different from the first compression ratio and the first compression type. Furthermore, the primitive signal may be comprised of digital or analogical signals, and the compressor may be an application-specific integrated circuit (ASIC) or a digital signal processor (DSP), which are specific to processing audio/video data. After the first, second and third digital data streams 306, 308 and 310 are produced, the compressor chooses a digital data stream with suitable compression ratios or compression types that can be stored or transmitted from multiple digital data streams (the first, second and third digital data streams 306, 308 and 310) with different compression ratios or compression types according to the storage space of the next device (for example, a hard disk 314) or the bandwidth limitation of the next path (for example, a wired/wireless network 316 or a network of a cell phone 318).

Moreover, the compressor may further comprise: an interface for configuring the multiple digital data streams compressed into different compression ratios or compression types, wherein the interface is a website or a software program that is built-in the system; a default configuration for configuring the multiple digital data streams compressed into different compression ratios or compression types; and a built-in program, which chooses a digital data stream with a suitable compression ratio or compression type from the multiple digital data streams with different compression ratios or compression types.

To sum up, a system for processing multimedia data outputs multiple digital data streams of different compressed ratios or types to adapt to varied storage space limitations and transmission bandwidth limitations without redundant compression and decompression according to one preferred embodiment of this invention. Thus, a digital data stream with a suitable compression ratio or compression type may be chosen directly and applied to the storage or transmission (for example, a hard disk 314, a network 316 or a cell phone 318) from the multiple digital data streams (the first, second and third digital data streams 306, 308 and 310) with different compression ratios or compression types. Therefore, the repetitive processing of digital data streams may be reduced so as to save central processing unit (CPU) resources.

Figure 4:
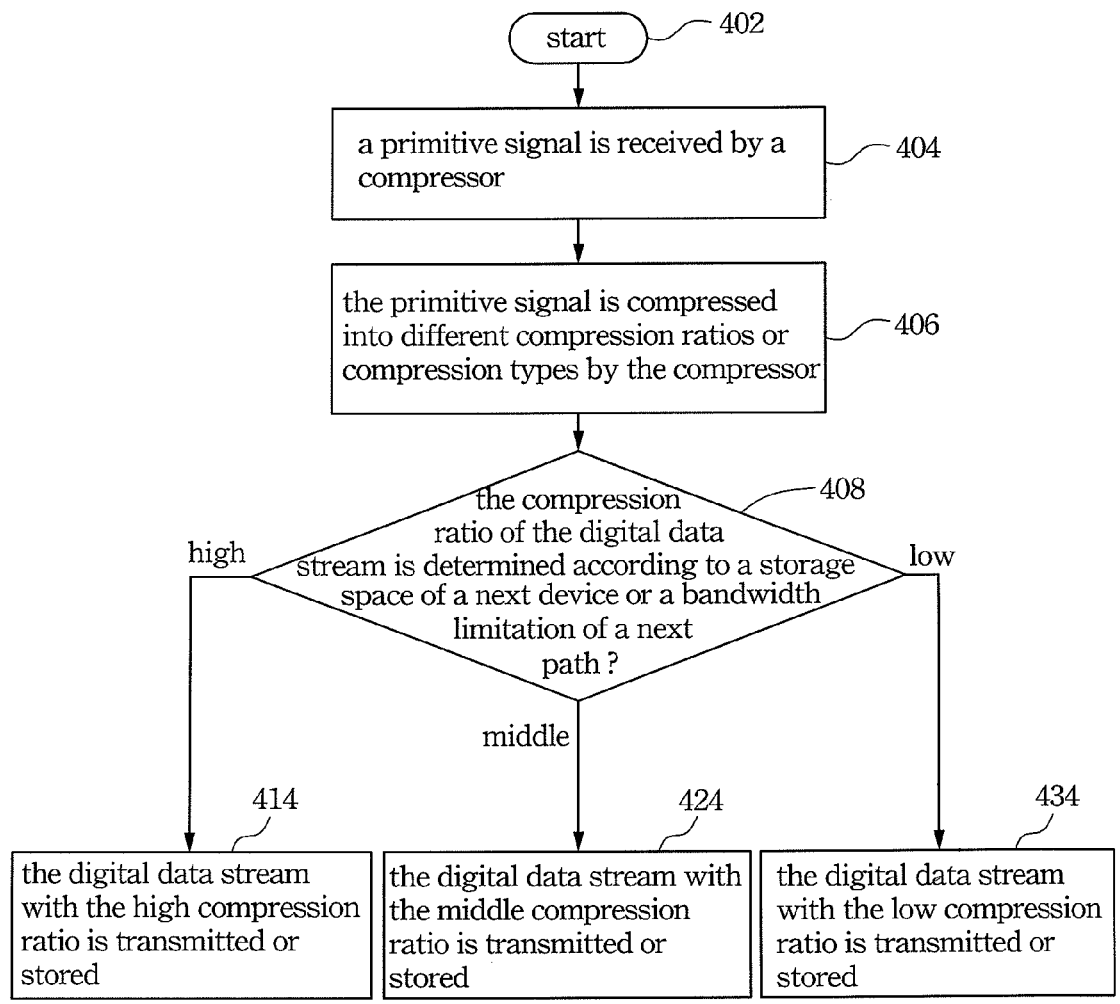
FIG. 4 is a flow chart illustrating a method for processing multimedia data according to another preferred embodiment of this invention.

FIG. 4 is a flow chart showing a method for processing multimedia data according to another preferred embodiment of this invention. As shown, after the flow starts in Step 402, a primitive signal is received in Step 404 and compressed into multiple digital data streams (for example, three digital data streams in this embodiment) with different compression ratios or compression types in Step 406, which further comprises steps of:
  a) configuring the multiple digital data streams to be converted into different signals with different compression ratios or compression types by an interface provided for a user;
  b) configuring the multiple digital data streams to be converted into different compression ratios or compression types by a website or a software program that is built-in the system and provided for a user; and
  c) determining the multiple digital data streams having different compression ratios or compression types to be compressed into by a default configuration.

Then, a digital data stream with a suitable compression ratio or compression type is stored or a transmitted from the multiple digital data streams with different compression ratios or compression types according to the storage space of the next device or limitations in bandwidth of the next path in Step 408, which further comprises choosing a digital data stream with a suitable compression ratio or compression type from the multiple digital data streams with different compression ratios or compression types by a built-in program.

For example, a digital data stream with a high compression ratio or type may be chosen directly to apply to be stored on a device with limited storage space or a transmitted with a limited bandwidth from the multiple digital data streams with different compression ratios or types in Step 414. Similarly, if other compression ratio levels or types are required for converting the digital data stream, a suitable compression ratio or type may be chosen for each case. Such as, a digital data stream having a middle compression ratio or type may be chosen when the middle compression ratio or type is required in Step 424; and a digital data stream with a low compression ratio or type may be chosen when the low compression ratio or type is required in Step 434.

From the above-mentioned embodiments, the invention has the advantages of:

1. saving CPU resources and thus improving the performance of the system.
2. removing the redundant procedure of the digital data stream and thus retaining the quality of the signal so as not to distort the multimedia data.
3. providing digital data streams of multiple compression ratios or compression types so as to apply to variable conditions without additional devices in charge of compression or decompression according to a configuration of a user, a default configuration of a system or the built-in program of a system after incorporating the present invention into an application-specific integrated circuit (ASIC) or a digital signal processor (DSP).
4. simplifying the procedure for processing multimedia data and thus improving the performance of a system.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A system for processing multimedia data, comprising:
   a primitive signal; and
   a compressor to convert the primitive signal into multiple digital data streams with different compression ratios or compression types,
   wherein the compressor chooses a digital data stream with a suitable compression ratio or compression type from the multiple digital data streams with different compression ratios or compression types according to the storage space of a next device or the bandwidth limitations of a next path for application in transmission or storage.

2. The system of claim 1, wherein the compressor is an application-specific integrated circuit (ASIC) or a digital signal processor (DSP).

3. The system of claim 1, further comprising an interface for configuring the multiple digital data streams having different compression ratios or compression types to be compressed into.

4. The system of claim 3, wherein the interface is a website or a software program that is built-in the system.

5. The system of claim 1, wherein the compressor further comprises a default configuration for configuring the multiple digital data streams having different compression ratios or compression types to be compressed into.

6. The system of claim 1, wherein the compressor further comprises a built-in program, which chooses a digital data stream with suitable compression ratios or compression types from the multiple digital data streams with different compression ratios or compression types.

7. A method for processing multimedia data, comprising steps of:
   converting a primitive signal received into multiple digital data streams with different compression ratios or compression types;
   choosing a digital data stream with a suitable compression ratio or compression type from the multiple digital data streams with different compression ratios or compression types according to the available storage space of a next device or the bandwidth limitations of a next path; and
   storing or transmitting the chosen digital data stream with a suitable compression ratio or compression type.

8. The method of claim 7, wherein the step of converting the primitive signal further comprises configuring the multiple digital data streams to be converted into different compression ratios or compression types by an interface provided for a user.

9. The method of claim 7, wherein the step of converting the primitive signal further comprises configuring the multiple digital data streams to be converted into different compression ratios or compression types by a website or a software program that is built-in the system and provided for a user.

10. The method of claim 7, wherein the step of converting the primitive signal further comprises determining the multiple digital data streams with different compression ratios or compression types to be compressed into by a default configuration.

11. The method of claim 7, wherein the step of choosing the digital data stream further comprises choosing a digital data stream with a suitable compression ratio or compression type from the multiple digital data streams with different compression ratios or compression types by a built-in program.

* * * * *